United States Patent [19]

Kataoka

[11] 3,973,182
[45] Aug. 3, 1976

[54] METHOD AND APPARATUS FOR DETECTING UNEVEN MAGNETIC FIELD BY HALL EFFECT IN SEMICONDUCTOR

[75] Inventor: Shoei Kataoka, Tanashi, Japan
[73] Assignee: Agency of Industrial Science & Technology, Tokyo, Japan
[22] Filed: Sept. 6, 1974
[21] Appl. No.: 504,676

Related U.S. Application Data

[62] Division of Ser. No. 281,408, Aug. 17, 1972, Pat. No. 3,835,376.

[30] Foreign Application Priority Data

Aug. 20, 1971  Japan.............................. 46-62929
Sept. 20, 1971  Japan.............................. 46-72459

[52] U.S. Cl.............................. 324/45; 340/174 HA
[51] Int. Cl.²......................................... G01R 33/06
[58] Field of Search..................... 324/43 R, 45, 46; 340/174 EB, 174 HA; 307/309

[56] References Cited
UNITED STATES PATENTS

3,003,105  10/1961  Kostyshyn............................ 324/45
3,701,126  10/1972  Reichard.............................. 324/45

OTHER PUBLICATIONS

Bobeck, The Magnetic Bubble, Bell Lab Record, vol. 48, July 1970, pp. 162–169.
Strauss, Detection of Cylindrical Magnetic Domains, Jour. of App. Physics, vol. 42, No. 4, Mar. 1971, pp. 1251–1257.
Kataoka et al., Semiconductor Functional Arrayed Detector, Proc. of IEEE, Apr. 1972, pp. 461–462, vol. 60, No. 4.

*Primary Examiner*—Robert J. Corcoran
*Attorney, Agent, or Firm*—Kurt Kelman

[57] ABSTRACT

The invention disclosed provides a semiconductor device and method whereby an inverted magnetic field such as a magnetic bubble is detected by placing one part of the semiconductor device comprising at least one Hall element having two input electrodes at opposite ends and at least one Hall output electrode in an inverted magnetic field, providing a current in the semiconductor device across said two input electrodes, and detecting the electrical voltage of the at least one Hall output electrode, and determining the inverted magnetic field position by changes in the electrical voltage of the Hall output electrode.

18 Claims, 21 Drawing Figures

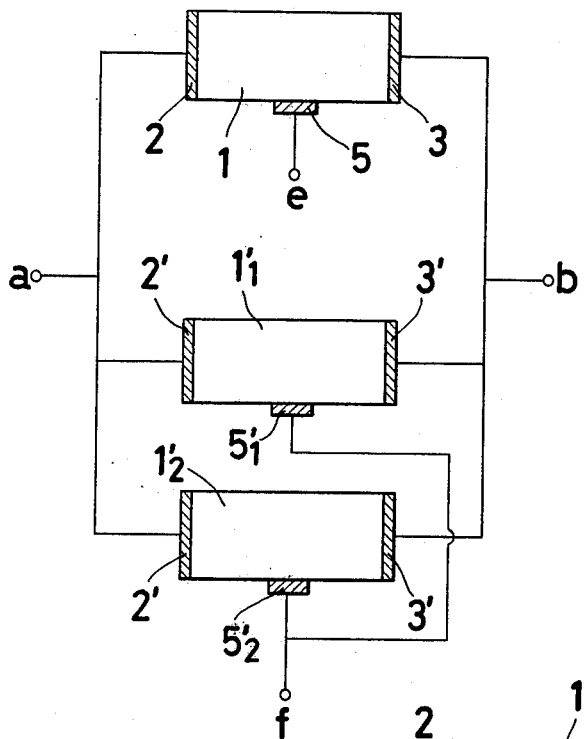
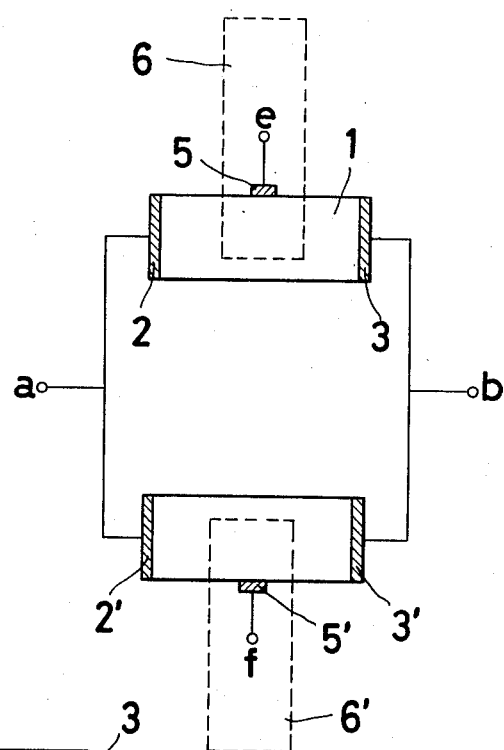
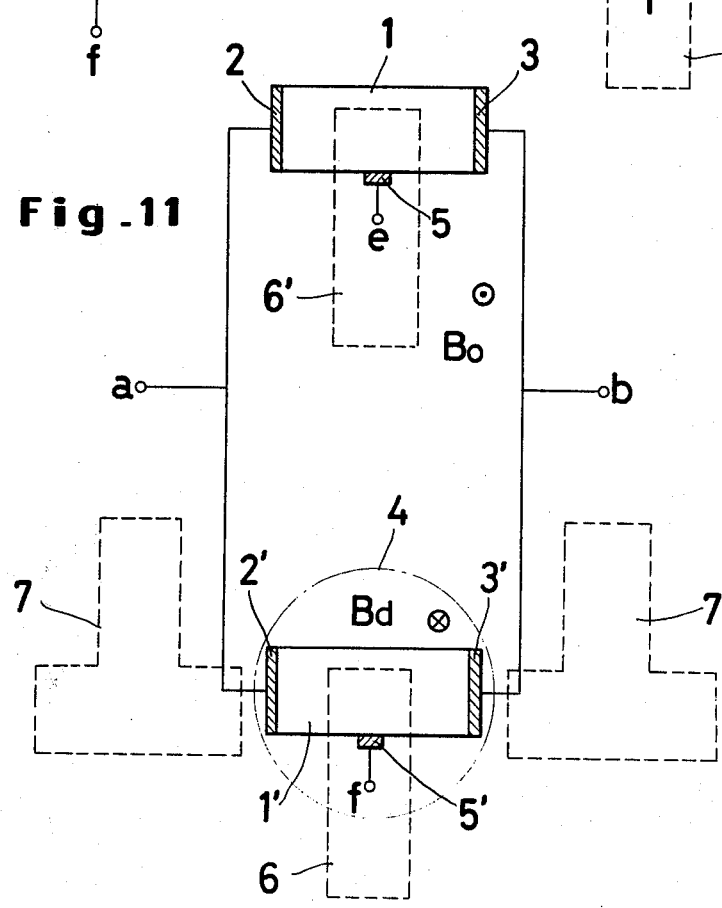

METHOD AND APPARATUS FOR DETECTING UNEVEN MAGNETIC FIELD BY HALL EFFECT IN SEMICONDUCTOR

REFERENCE TO COPENDING APPLICATION

This is a divisional application of my copending application U.S. Ser. No. 281,408, filed Aug. 17, 1972, now U.S. Pat. No. 3,835,376.

BACKGROUND OF THE INVENTION

This invention generally relates to method and apparatus for detecting uneven magnetic field, and more particularly to method and apparatus for electrically detecting the existence of a local inversion of magnetic field such as magnetic bubble domain.

Recently it has been found that a local inversion of magnetic field or magnetic bubble exists in an orthoferrite or garnet element subjected to a bias magnetic field and the art of applying this phenomenon to memory or logic operation has been developed. The conventional method for electrically detecting magnetic bubble domains uses the Hall effect of semiconductor or the magnetic resistive effect of semiconductor or magnetic elements.

As for the prior art of detecting method using the Hall effect of semiconductor, a semiconductor element whose active area is made smaller than the dimensions of the magnetic bubble is conventionally used to detect the magnetic field from the magnetic bubble. In this connection the size of the semiconductor element varies with the size of the magnetic bubble. The semiconductor device to be used for detecting a relatively small magnetic bubble must be accordingly reduced in size, and therefore difficulties arise in producing suitable semiconductor elements. Also, disadvantageously, the detected output signal decreases with the smallness of the element, and accordingly the signal-to-noise ratio decreases. Thus, such small element can not be used for detecting a minute magnetic bubble as small as 5 $\mu$m in garnet.

Conventional four-terminal Hall element makes it actually impossible to build a two-dimensional array to detect magnetic bubbles if any, in two dimensional space owing to the complexity of the wiring.

The main object of this invention is to provide a method for detecting uneven magnetic field in which a magnetic field in a given fixed direction and an inverted magnetic field coexist, by using the newly found galvano-magnetic effects of semiconductor devices.

Another object of this invention is to provide a method for digitally or analogously detecting magnetic bubbles in the magnetic body which method permits the use of a large semiconductor element compared with the magnetic bubble to be detected.

Another object of this invention is to provide an apparatus for detecting uneven magnetic field which apparatus facilitates the building of a two-dimensional array structure.

Another object of this invention is to provide a method for electrically detecting the position of magnetic bubble domains in the magnetic body without shifting the magnetic bubbles.

Another object of this invention is to provide a method for digitally or analogously and simultaneously detecting the position of a plurality of magnetic bubbles.

Another object of this invention is to provide a system to perform logic operations in the course of detecting magnetic bubble domains.

SUMMARY OF THE INVENTION

The method for detecting uneven magnetic field according to this invention is based on the new idea, in which both the un-inverted and inverted magnetic fields, namely, uneven magnetic field distributions themselves are simultaneously utilized to give pronounced effect on Hall effect in semiconductor. The method comprises the steps of; disposing one part of semiconductor device comprising at least one Hall element having two input electrodes and at least one Hall output electrode in an inverted magnetic field and the rest part of the semiconductor device in an un-inverted magnetic field, providing a current in the semiconductor device across said two input electrodes, and detecting the electrical voltage of said at least one Hall output electrode, and thereby determining the inverted magnetic field position by changes in the electrical voltage of the Hall output electrode.

Other objects and features of this invention will be obvious from the following description which is made with reference to the attached drawings in which:

BRIEF DESCRIPTION OF THE DRAWING

FIG. 10 is an explanatory drawing which shows one embodiment for carrying out logic operations using three three-terminal Hall elements.

FIGS. 11 through 13 show a method for noise elimination adaptable to the detector of this invention.

Figure 1:
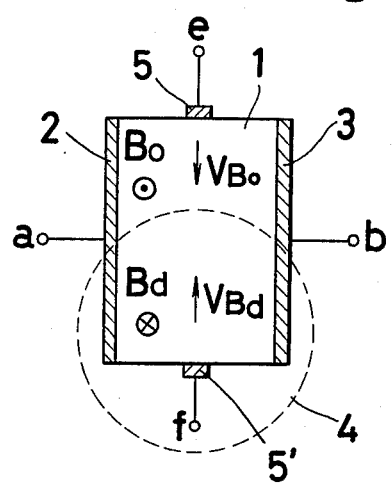
FIG. 1 is an explanatory drawing which shows the principle of the method for detecting uneven magnetic field by using a four-terminal Hall element according to the present invention.
Figure 2:
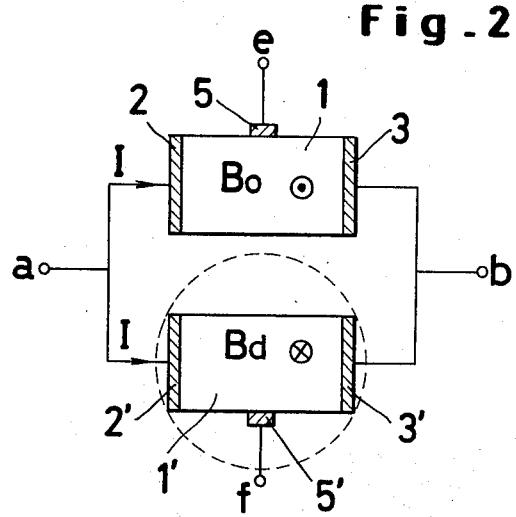
FIGS. 2 through 4 are explanatory views showing methods for detecting uneven magnetic field by using three-terminal Hall elements according to the present invention.

DETAILED DESCRIPTION OF THE INVENTION:

Referring to FIG. 1, a four-terminal Hall semiconductor device is now described. The device 1 has current electrodes 2, 3 on the opposite major ends and output Hall electrodes 5, 5', on the opposite sides. If this device is subjected to a uniform magnetic field $B_o$, a Hall output voltage will appear across the Hall electrodes 5, 5'. If one part (lower half in this case) of it is subjected to an inverted magnetic field $B_d$ and rest part (upper half in this case) of it is simulateneously to an uninverted magnetic field $B_o$, the boundary of which cuts across the current electrodes, two different Hall electromotive forces $V_H$ and $V_H$ opposite in polarity will appear in the upper and lower halves of the device because the magnetic fields in the halves are opposite to each other. If the un-inverted bias magnetic field $B_o$ is equal to the inverted magnetic field $B_d$ both in strength and in area, the two Hall electromotive forces will be cancelled, thus producing no Hall voltage across the output electrodes 5, 5'. Therefore, the four-terminal Hall semiconductor device is equivalent to a parallel connection of two three-terminal elements formed by separating at the boundary of inverted magnetic field (see FIG. 2). If either but not both of the parallel-connected elements 1, 1' is subjected to an inverted magnetic field $B_d$, and the other element to an un-inverted bias magnetic field $B_o$, then little or practically no voltage will appear across the output electrodes 5, 5'. Contrary to this, if both elements are subjected to inverted magnetic field only or to bias magnetic field only there will be a substantial output voltage. Consequently, it is possible to determine the presence of an inverted magnetic field in one or the other of the elements by absence of a substantial output voltage. The same effect can be obtained with the parallel-connected elements of FIG. 3 which are the same as those of FIG. 2 except for the relative positions of the output electrodes (c.f. FIG. 2).

This parallel-connection not only can detect the presence of an inverted magnetic field (magnetic bubble), but also can perform logic operations using magnetic bubbles.

A discussion now follows of several devices comprised of parallel connected elements of the same material and configuration.

Figure 3:
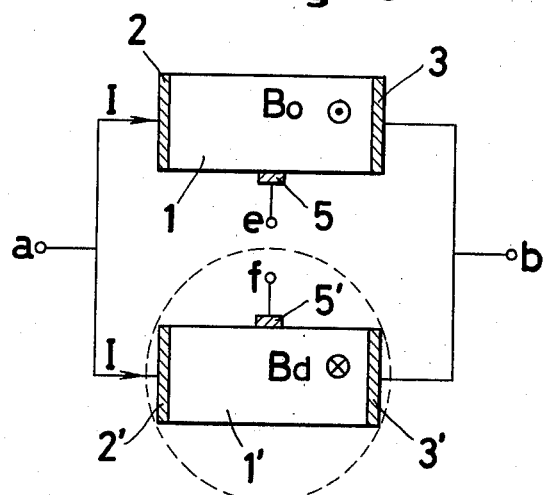

Referring to FIG. 3, an AND circuit using the parallel-connection as mentioned above is described as follows. In this device the output electrodes of the elements are positioned on opposite sides of the respective elements with respect to the direction of the electric current. Accordingly, if element 1 is subjected to an un-inverted bias magnetic field $B_o$ and element 1' is subjected to an inverted magnetic field $B_d$ due to a magnetic bubble, and if the potential of the electrodes 2, 2' of both element is taken as zero, the potential of the output electrode 5 of the element 1 is given by:

$$V_e = \frac{V}{2} + \frac{R_H}{2t} IB_o \qquad (1)$$

where $v$ is the voltage applied across the terminals $a$, $b$; $R_H$ is the Hall coefficient of the semiconductor; $t$ is the thickness of the element and $I$ is the current through the element.

In view of the polarity of the Hall voltage of the element 1' being opposite to that of the Hall voltage of the element 1, the potential of the output electrode 5' of element 1' is given by:

$$V_f = \frac{V}{2} - \frac{R_H}{2t} IB_d \qquad (2)$$

Thus, the output voltage appearing across terminals $e$ and $f$ is given by:

$$V_{ef} = \frac{R_H}{2t} I(B_o + B_d) \qquad (3)$$

As in practice, magnetic fields $B_o$ and $B_d$ are about equal in strength and opposite in direction, $V_{ef}$ is substantially zero.

If both elements are subjected to the bias magnetic field $B_o$ and there exists no magnetic bubble in either element, the output voltage is given by:

$$V_{ef} = \frac{R_H}{t} IB_o \qquad (4)$$

Thus viewed, the parallel-connection constitutes a NAND circuit of magnetic bubbles.

If there are magnetic bubbles on both elements, the output voltage is given by:

$$V_{ef} = \frac{R_H}{t} IB_d \qquad (5)$$

In this case it functions as an AND circuit of magnetic bubbles. Since magnetic field $B_o$ is opposite to magnetic field $B_d$, it can be determined from the polarity of the output voltage whether the parallel-connection functions as a NAND circuit or an AND circuit.

Figure 4:
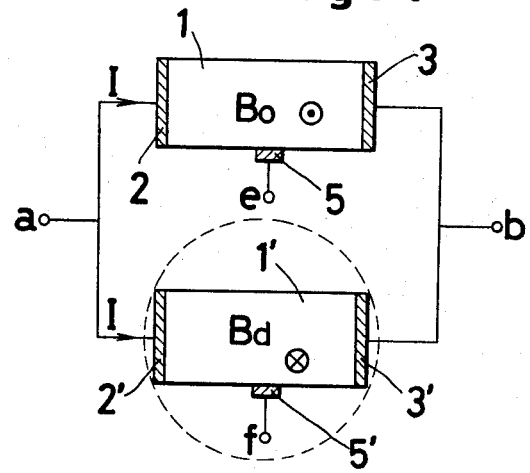

Referring to FIG. 4, a parallel-connection having the output electrodes 5, 5' provided on the same side of each element 1, 1' with respect to the current is shown.

In this parallel-connection the output voltage will appear in a different way from that in the parallel-connection as mentioned above.

A three-terminal semiconductor element having current electrodes 2, 3 and an output Hall electrode 5 and a similar device 1' having current electrodes 2', 3' and an output Hall electrode 5' are in parallel-connection at their current electrodes, and the parallel assembly thus formed is connected to terminals $a$ and $b$. Assume that the magnetic fields passing through elements 1, 1' are $B_o$ and $B_d$ respectively.

The potential $V_e$ appearing at the output electrode 5 of the element 1 passing the current I is given by:

$$V_e = \frac{V}{2} + \frac{R_H}{2t} IB_o \qquad (6)$$

Likewise, the potential $V_f$ appearing at the output electrode 5' of the element 1' passing a current I is given by:

$$V_f = \frac{V}{2} + \frac{R_H}{2t} IB_d \qquad (7)$$

Accordingly, the voltage $V_{ef}$ appearing between the output electrodes 5 and 5' is given by:

$$V_{ef} = \frac{R_H}{2t} I(B_o \neq B_d) \qquad (8)$$

As seen from this equation, if both elements 1, 1' are subjected to the same uniform magnetic field ($B_o = B_d$), no voltage will appear between the output electrodes 5 and 5'. Contrary to this, if the magnetic field to which these elements are subjected is not uniform ($B_o \neq B_d$), a voltage will appear between the output electrodes 5 and 5'.

The voltage is a function of the difference in the magnetic field strength and therefore it will be a measure of the unevenness of the magnetic field.

If one element 1 of the parallel-connection is subjected to an inverted bias magnetic field $B_o$ and the other element 1' is subjected to an inverted magnetic field $B_d$, the output voltage $V_{ef}$ is given by:

$$V_{ef} = \frac{R_H}{2t} I(B_o - B_d)|V_{ef}| = \frac{R_H}{2t} I(|B_o| + |B_d|) \qquad (9)$$

Figure 5:
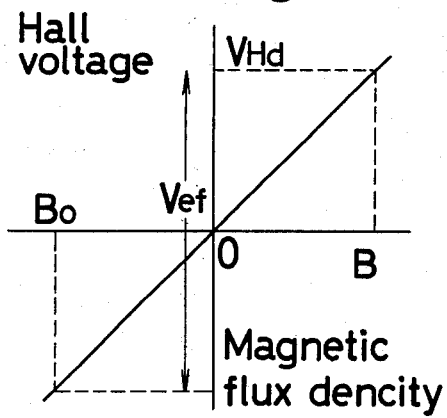
FIG. 5 is a graph showing the characteristics of a Hall element.

As shown in FIG. 5 if the absolute value of the bias magnetic field strength is nearly equal to that of the inverted magnetic field strength ($|B_o| \simeq |B_d|$), the output voltage $V_H$ is given by:

$$V_H = \frac{R_H}{t} IB_d \qquad (10)$$

In no magnetic bubble exists in either element, the output voltage V given by:

$$V = \frac{R_H}{t} I(B_o - B_o) = 0 \qquad (11)$$

Thus a parallel connection of two three-terminal elements according to this invention will produce no output voltage for no magnetic bubble.

It is not necessary to use three-terminal Hall elements of the same characteristics. Neither is it necessary to pass the same amount of electric current through both elements. Assume that the product sensitivities of the Hall elements 5, 5' are K and K' respectively and that electric currents flowing through the elements 1, 1' are I and I'. The voltage $V_{ef}$ appearing between the output electrodes 5 and 5', when a magnetic bubble is present on the element 1', is given by:

$$V_{ef} = \frac{1}{2} KIB_o - \frac{1}{2} K'I'B_d \qquad (12)$$

As is apparent from this, no output voltage appears for no magnetic bubble ($B_d = B_o$), if the following equation is satisfied:

$$KI = K'I' \qquad (13)$$

Figure 6:
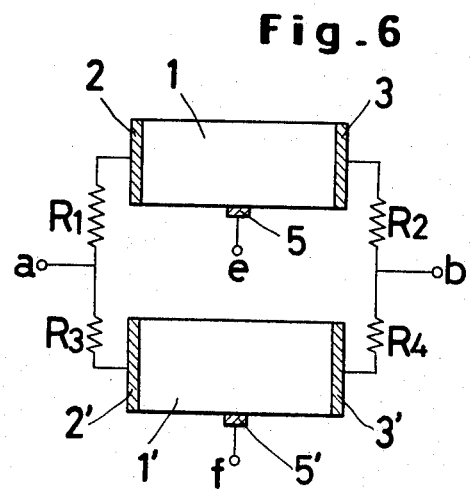
FIG. 6 and FIG. 7 are explanatory views showing other embodiments for detecting uneven magnetic field by using three-terminal semiconductor devices according to the present invention.

The electric currents flowing through the Hall elements 1, 1' can be controlled to meet equation (13) by properly selecting the resistors $R_1$, $R_2$, $R_3$ and $R_4$ which are series-connected to the elements as shown in FIG. 6.

A parallel-connection of elements thus controlled will produce the following output voltage $V_{ef}$ between the output electrodes 5, 5' of the elements for a magnetic bubble present:

$$V_{ef} = \frac{1}{2} KI(B_o - B_d) \qquad (14)$$

If no magnetic bubble exists, no output voltage will appear, but if a magnetic bubble exists on either of the elements 1, 1', the output voltage $V_{ef}$ is given by:

$$V_{ef} = \frac{1}{2} KI (|B_o| + |B_d|) \qquad (15)$$

Figure 7:
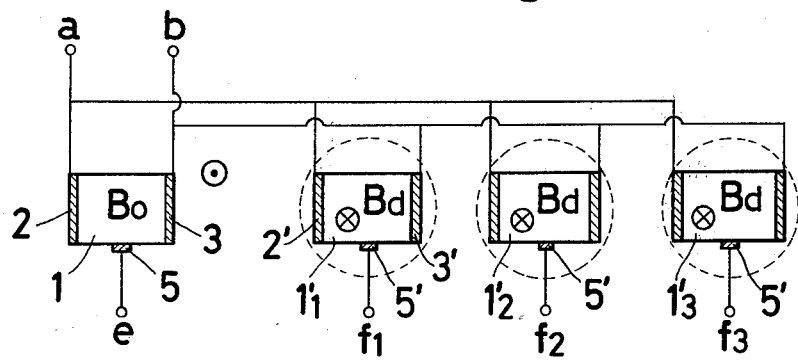

The number of the three-terminal Hall elements is not limited to two. This invention is equally applicable to three or more elements as required. If use is made of a plurality of elements, one of these elements can be subjected to a reference magnetic field, i.e. an un-inverted bias magnetic field $B_o$ and used as a common reference unit. In FIG. 7, an array for detecting a plurality of magnetic bubbles is shown as comprising a plurality of three-terminal Hall elements arranged in a line. The element 1 positioned at the left end functions as a reference, and therefore only this element 1 is constantly subjected to the un-inverted magnetic field $B_o$ so that a magnetic bubble will not appear on this reference element.

A number of three-terminal Hall elements $1'_1, 1'_2, 1'_3$ ... are positioned on the right side of the reference element 1 at places where magnetic bubbles may appear. The current electrodes of these elements are connected in parallel to terminals $a$ and $b$. A voltage is applied across these terminals $a$ and $b$ to cause electric current to flow through each of the elements, and then if a voltage appears between the terminal $e$ which is connected to the output electrode of the reference element 1 and any one of the terminals $f_1, f_2, f_3$ ... which are likewise, connected to the output electrodes of the other elements $1'_1, 1'_2, 1'_3$ ... respectively, it will indicate the presence of a magnetic bubble at the relevant element. More specifically, a magnetic bubble exists at the element whose output electrode provides output voltage with respect to the output electrode $e$ of the reference element.

Figure 8:
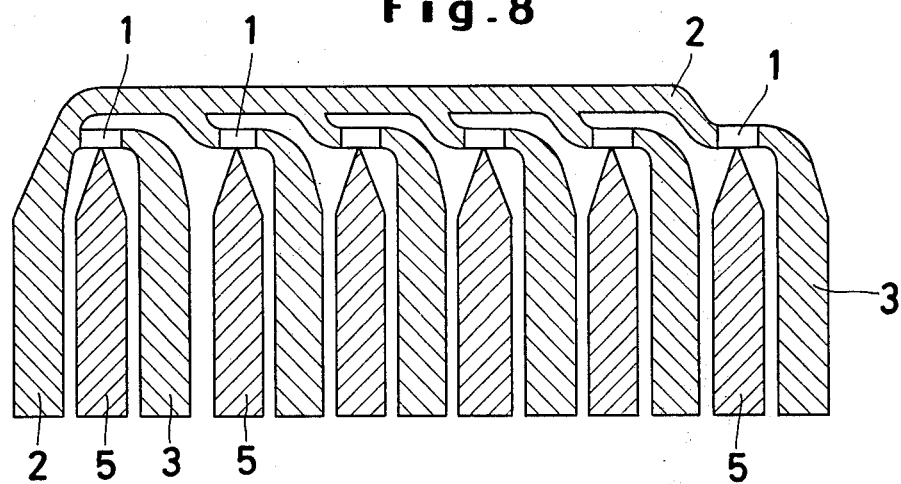
FIG. 8 and FIG. 9 are plan views of an array pattern of three-terminal Hall elements according to the present invention.
Figure 9:
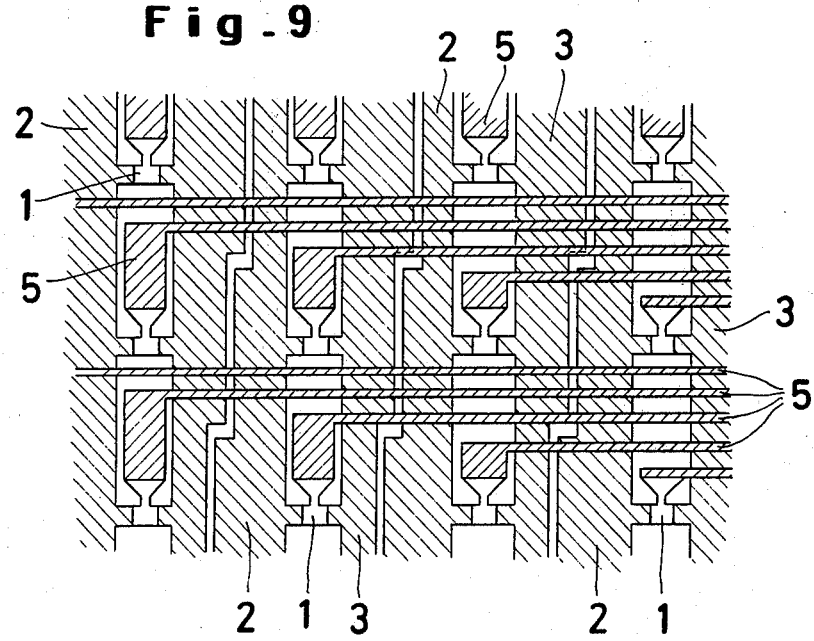

Advantageously, this arrangement of numerous three-terminal elements can be manufactured in the form of integrated circuit as shown in FIGS. 8 and 9. The circuit patterns show that one of the current electrodes of each three-terminal Hall element 1 is connected to a common terminal 2, whereas the other current electrodes 3 are separated from each other, thus permitting electric current to each element 1 to be controlled as required.

FIG. 9 shows a pattern of three-terminal Hall elements 1 arranged in a checkerboard pattern. In this array the current electrodes 2, 3 of the elements are connected in common and only the output electrodes 5 of the elements need be independently extended. Therefore, fabrication of a two-dimentional array of three-terminal Hall elements to detect magnetic bubbles according to this invention is very easy.

The detecting method as mentioned above can be applied to logic operation of magnetic bubble domains as follows:

Turning to FIG. 3, two three-terminal Hall elements 1 and 1' are connected in parallel to terminals $a$ $b$, each element having input electrodes 2, 3 or 2', 3' and output electrodes 5 or 5'. If this parallel connection is subjected to the same magnetic field, no output voltage will appear across output terminals e and f, which are connected to the output electrodes 5 and 5' of the elements 1, 1'.

However, if one of the elements is subjected to an inverted magnetic field, a voltage proportional to the difference in magnetic field will appear.

With this arrangement a voltage appearing across terminals e and f can be used as the logic result of a logic operation of the magnetic bubbles situated in the positions of the elements 1, 1'. More specifically, if there exists an inverted magnetic bubble $B_d$ in either element, a voltage proportional to the difference will appear, thus permitting performance of EXCLUSIVE OR logic operation of the magnetic bubble on both elements by means of the output voltage. If a D.C. voltage is applied across terminals a and b, the polarity of output voltage appearing across terminals e and f depends on which element is subjected to a magnetic bubble. However, if an A.C. voltage is applied across terminals a and b, an A.C. output voltage will appear regardless of which element is subjected to an inverted magnetic field, making EXCLUSIVE OR operation possible.

Referring to FIG. 10, an OR logic circuit using three three-terminal Hall elements is shown. One of these elements is positioned at a place where no magnetic bubble exists, and if magnetic bubbles appear on the other two elements $1'_1$ and $1'_2$, the logic operation of the magnetic bubbles will be performed. The output terminals f of the elements $1'_1$ and $1'_2$ are connected in common, and therefore the output voltage appearing across terminals e and f is the result of the OR logic operation of the magnetic bubbles at the positions of the elements $1'_1$ and $1'_2$. If the output electrode 5 of the elements 1 is shifted to the opposite side of the element 1, or otherwise if a magnetic bubble exists constantly at that position, the output voltage across terminals e and f will provide the result of NOR of the magnetic bubbles at the positions of the elements $1'_1$ and $1'_2$. The number of the elements used in OR or NOR circuits vary with the number of magnetic bubbles. As a matter of course, logic operations other than OR and NOR will be possible by combining similar Hall elements in suitable arrangement. As mentioned above, the logic operation is performed in the process of magnetic-to-electric signal conversion by means of at least two parallel-connected three terminal Hall elements which are put on a magnetic body containing magnetic bubbles.

In actual cases where magnetic bubbles exist in a very thin wafer of garnet or in an epitaxially grown garnet, spurious output is likely to appear even in the absence of magnetic bubbles. This is because the detecting elements are positioned near electric wires or on permalloy patterns, for driving magnetic bubbles thus detecting not only the magnetic field originating from the magnetic bubble but also the stray magnetic fields caused by current in electric wires or permalloy patterns magnetized by rotating magnetic field.

The method of eliminating such spurious output is described as follows:

Turning to FIG. 11, two three-terminal Hall elements 1 and 1' each having a ohmic input electrodes 2, 3 and output electrode 5 applied on a semiconductor body, are parallel-connected to terminals a and b, the element 1 is positioned at the place where no magnetic bubble appears whereas the element 1' is situated at the place where magnetic bubble may appear. Permalloy patterns 6, 7 for driving magnetic bubbles are provided in the same way for both elements, and the magnetic bubble 4 is indicated in the form of a circle (broken line). A permalloy 6' similar to that positioned at the element 1' is put at the element 1 where no magnetic bubble appears. Thus, both permalloys 6', 6 will be equally subjected to the same rotating in plane magnetic field for driving magnetic bubbles, and therefore both elements 1 and 1' will be subjected to magnetic fields of equal strength originating from the permalloys thus magnetized by the rotating magnetic field. Accordingly, the spurious output components will be cancelled in the final output which is given in the form of the difference between the Hall voltages of the elements 1 and 1' across the terminals e and f.

FIG. 12 shows a parallel-connection of two three-terminal Hall elements 1 and 1' which are positioned so as to be opposite to each other with respect to the output electrodes thereof. In this parallel connection an output voltage will appear in case of the presence or absence of magnetic bubbles both in the elements 1 and 1'. Therefore, if the permalloys 6 are positioned in the opposite as shown, the spurious voltage noise due to the magnetized permalloys will be cancelled in the final output voltage.

Figure 13:
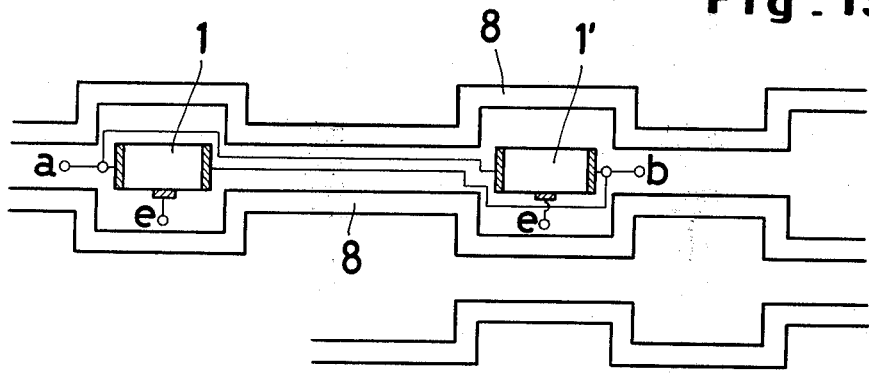

Referring to FIG. 13, two electric conductors 8 are arranged in a symmetrical relation with respect to two three-terminal elements 1, 1' which are connected so as to produce output voltage in a differential way. Both electric conductors carry electric currents of equal amount, and therefore both elements 1 and 1' will be subjected to magnetic fields of equal strength caused thereby with the result that no spurious output appears in the final output voltage.

The above embodiments are described with regard to two elements, but the same structure can be applied to a parallel connection of numerous elements to simultaneously detect different magnetic bubbles.

As is apparent from the above, spurious output can be completely eliminated and at the same time a high sensitivity can be realized by providing means for magnetic bubble drive of the same characteristics at the positions of the Hall elements which function in a differential way.

The results of the actual measurements are given as follows:

A linear seven bit array detector consisting of the parallel-connection of three-terminal elements as shown in FIG. 6, and a two-dimensional, 18 bit array detector were manufactured in the form of integrated circuit.

The semiconductor body used was of a single crystal of n-type InSb (Resistivity $\rho = 5.5 \times 10^{-3}$ $\Omega$cm, mobility $\mu = 71,000$ cm$^2$/Vsec). Each element was 10 $\mu$m thick, 60 $\mu$m long and 50 $\mu$m wide. An extension of the semiconductor material 10 $\mu$m in width was provided at the center of the element to serve as the Hall electrode.

Figure 14:
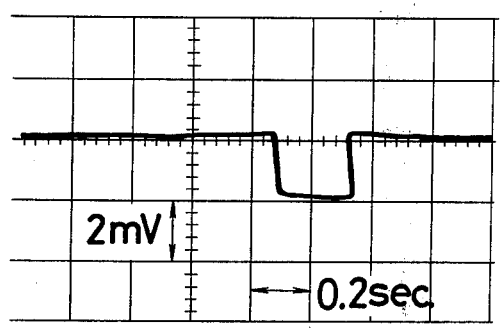
FIG. 14 is an oscillogram showing the detecting characteristics of a three-terminal Hall detector.

In detecting a magnetic bubble (about 100 $\mu$m in diameter) in a YFeO$_3$ under the bias magnetic field of 20 oe, an output voltage of about 2.0 mV was obtained at an electric current of 10 mA in each element. FIG. 14 shows the oscillogram of the dynamic detection of magnetic bubble, which was driven by the rotating magnetic field at 2 H$_z$, showing excellent S/N ratio.

Also, a two-dimensional, 100 bit array (10 × 10) was manufactured. This consisted of three-terminal elements of the same semiconductor material as mentioned above. The dimensions of each element was 50

μm (length) × 40 μm (width) × 5 μm (thickness), and it had a 10 μm electrode extension for the Hall electrode. The input resistance was about 50 Ω. The array detector was used to detect a magnetic bubble in the same YFeO₃ as mentioned above. The output voltage produced was about 3 mV at an electric current of 10 mA in each element. The inventor confirmed that by selecting suitable positionings of the Hall terminals with respect to the direction of electric current it was possible to perform AND, OR, EXCLUSIVE OR and other logic operations.

Also, similar two-dimentional array structures were manufactured with vacuum deposited film of InSb. These structures were of the same size the devices mentioned earlier except for thickness which was about 2 to 3 μm. Output voltages of about 2-3 mV were obtained at electric current of 5 mA in each element.

The magnetic field of the magnetic bubbles detected was about 20 gauss. However, the inventor found that the output voltage would rise to about 10-15 mV, if use were made of a magnetic material which was of good enough quality to generate a magnetic bubble as strong as 100 gauss. This figure is several times as large as the output voltage with the conventional detector.

It has been considered that the active area of a Hall element must be smaller than that of the magnetic bubble to detect a magnetic field from the magnetic bubble. However, it was found by the present inventor that this is not at all true.

Figure 15:
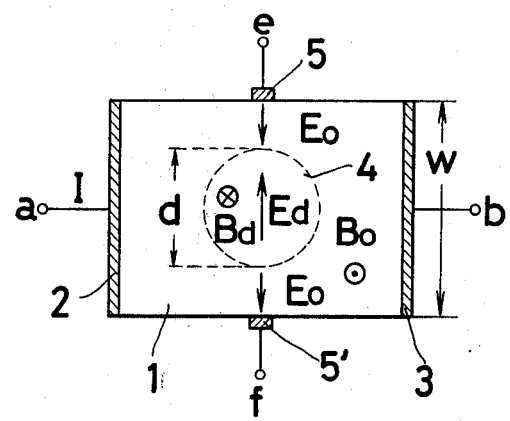
FIG. 15 shows another embodiment using four-terminal Hall elements for detecting uneven magnetic field according to the present invention.

Referring to FIG. 15, the Hall element 1 as shown is about two times as wide as the magnetic bubble domain 4. Assuming that an electric current I is passed through the Hall element, the output voltage $V_{out}$ will be equal to an integral from electrode 5 to electrode 5' of the Hall electric field $E_d$ due to a magnetic field from a bubble $B_d$ plus the Hall electric field $E_o$ due to the bias magnetic field. The Hall electric fields $B_d$ and $B_o$ are substantially equal in strength, but are opposite in direction, and therefore, the fields $E_d$ and $E_o$ are substantially equal in absolute value but are opposite in direction.

In view of this and in view that the element $w$ is twice as wide as the magnetic bubble $d$ there will appear no output voltage:

$$V_{out} = E_d d + E_o (w - d)$$
$$= E_o + E_o d$$
$$= 0$$

where $d$ is the diameter of the magnetic bubble and $w$ is the width of the element.

In absence of a magnetic bubble the output voltage will be the Hall voltage for $B_o$, which is $V_{out} = E_o w$, but in the presence of a magnetic bubble it will be substantially zero. Thus, large output voltage is obtained.

According to this invention an element on the order of two times as large as the magnetic bubble to be detected can be used.

The use of relatively large-sized elements is very advantageous in detecting a minute magnetic bubble (for instance, 5 μm in diameter) in garnet, in that the elements are easy to manufacture and the output is large.

Figure 16:
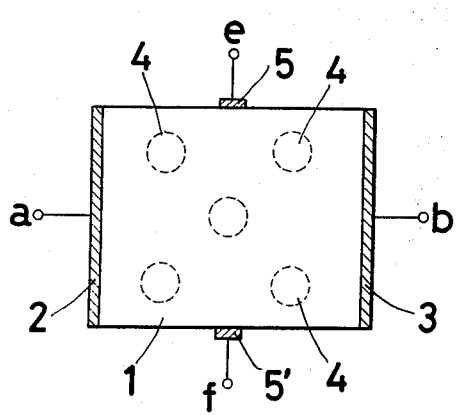
FIG. 16 shows another embodiment using four-terminal Hall elements for detecting uneven magnetic fields according to the present invention.

As a matter of course the principle of this invention can be equally applied for the detection of a plurality of small magnetic bubbles within a single element as shown in FIG. 16. The Hall voltage will vary with the number of the magnetic bubbles within the element, and therefore the number of magnetic bubbles can be determined.

Figure 17:
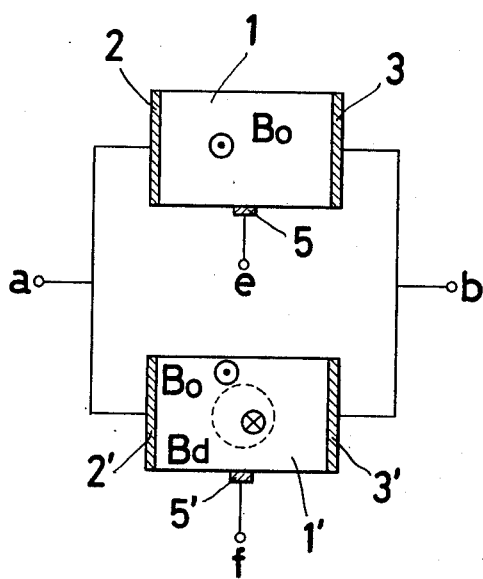
FIG. 17 shows another embodiment using three-terminal Hall elements for detecting uneven magnetic field according to the present invention.

The application of the principle above-mentioned with reference to FIG. 15, is not limited to four-terminal Hall elements, and it still holds for a three-terminal element. FIG. 17 shows an embodiment in which the principle is applied to a parallelconnection of two three-terminal Hall elements 1, 1'. These elements are so connected that they function in such a differential way to produce the difference between the output voltages of the elements as an output voltage across terminals $e$ and $f$.

The structural and functional variations discussed above in respect to FIG. 3 to FIG. 13 also apply in this case.

This parallel-combination of three-terminal elements can be equally applied to detection of a plurality of magnetic bubbles.

The results of actual measurements are described as follows:

Elements of variety of dimensions (3 μm in thickness, but ranging from 72 μm to 400 μm in length and from 60 μm to 200 μm in width) were made of an n-type InSb (Resistivity $\rho$=4.7 × 10⁻³ Ωcm, mobility $\mu$ = 7 × 10⁴ cm²/Vsec). These elements were used to detect magnetic bubbles (about 100 μm in diameter) in a YFeO₃ which was subjected to a bias magnetic field of 30 oe. Maximum output voltages were obtained in the elements whose width-to-diameter ratio (w/d) ranged from 1.1 to 1.5, and the maximum output voltage was as large as 12 mV at electric current of 30 mA in the element. This figure of the output voltage means that the output voltage for a magnetic bubble of 100 gauss will be 35 mV or more, 10 times or one hundred times as large as the output voltage in the conventional detector.

The same results could be obtained in case of the array structure composed of three-terminal elements.

Figure 18:
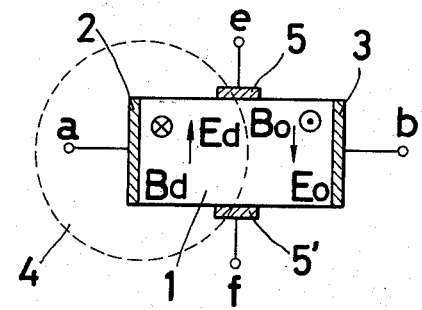
FIG. 18 illustrates detection of a magnetic bubble using a four-terminal Hall element according to the present invention.
Figure 19:
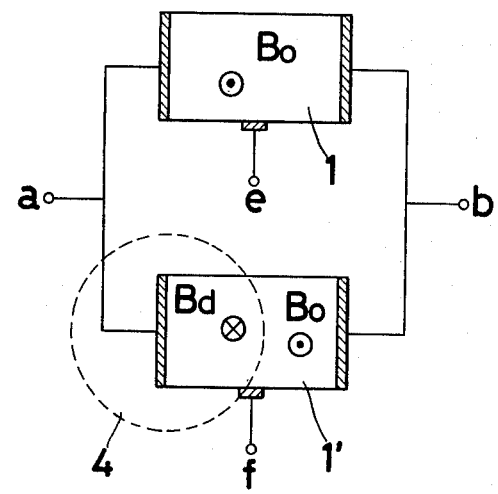
FIG. 19 illustrates detection of a magnetic bubble using two three-terminal Hall elements according to the present invention.

Referring to FIG. 18, a magnetic bubble 8 (broken line) cuts across the output electrodes 5, 5' of a four-terminal Hall element 1. The inversion boundary of the magnetic field arises at the boundary, and the strength of the magnetic field is substantially zero along the boundary, and therefore no output voltage will appear. In absence of magnetic bubbles an output voltage due to the bias magnetic field appears. Thus, this embodiment produces output voltage in the same fashion as the embodiment shown in FIG. 15. The above principle can be equally applied to a parallel connection of three-terminal Hall elements 1, 1' as shown in FIG. 19.

The results of the actual measurements are described as follows:

Semiconductor elements used were made of n-type InSb; length 60 μm, width 50 μm, thickness 5 μm, and width of a Hall output electrode 5 μm. The Hall element was used to detect magnetic bubbles in a YFeO₃ at the bias magnetic field of 20 oe. In absence of magnetic bubble an output voltage of about 2 mV appeared at a current of 10 mA. When a magnetic bubble appeared in such a way that the boundary of the magnetic bubble domain cuts across the Hall electrodes, no Hall voltage was produced. When no bubble was present, a Hall voltage of 2 mV due to bias magnetic field appeared and thus an output voltage of about 2 mV was obtained as an indication of magnetic bubble.

Figure 20:
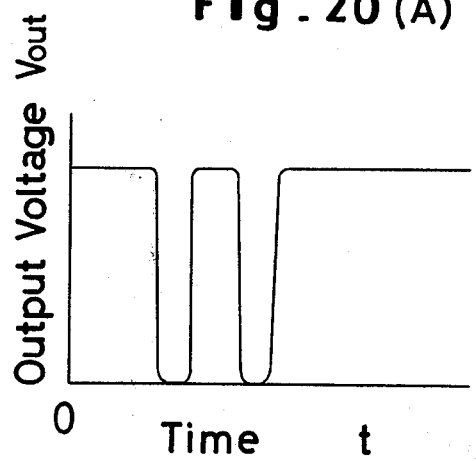
FIGS. 20(A) and 20(B) are graphic representations of the time-vs-output relation of two typical types of output signals obtained in the detection of a traveling magnetic bubble according to the present invention.
Figure 20:
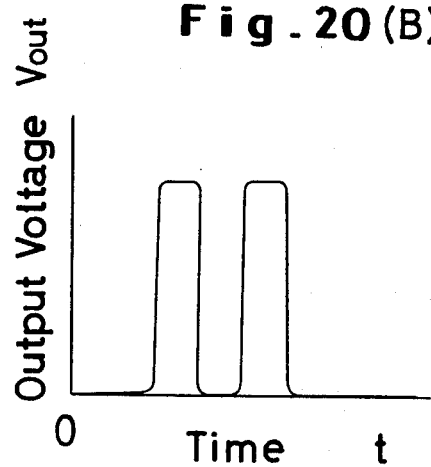

FIG. 20 is a graphic representation of output vs time in detecting a traveling magnetic bubble. FIG. 20(A)

and FIG. 20(B) show two typical types of output signals.

Although the above description is made in terms of a magnetic bubbles, it should be noted that the principle of this invention holds in all cases where an inversion of magnetic field exists such as in magnetic strip domain device, domain tip device, magnetic tape and magnetic disk.

As mentioned above, the apparatus for detecting uneven magnetic field according to this invention uses the resultant galvanometric effect on a semiconductor device, the effect being caused by an inverted magnetic field such as magnetic bubble domain applied to a part of the semiconductor device and by an un-inverted magnetic field such as the one originating from a magnetic body free from magnetic bubbles applied to the rest part of the semiconductor device, thus permitting the efficient and reliable detection of uneven magnetic field such as magnetic bubbles. One of the advantages of this invention is to permit the use of a semiconductor body which is larger than the magnetic bubble to be detected so that consequently the output voltage accordingly increases and the signal-to-noise ratio is substantially improved. Another advantage of this invention is that it makes possible the construction of a two-dimensional array comprising numerous semiconductor elements in the simplest possible structural arrangement. It is therefore easy to build a two-dimensional array of a large number of semiconductor elements capable of simultaneously detecting a plurality of magnetic bubbles without shifting the magnetic bubbles or by shifting them only a short distance, thus finally reducing access time to magnetic bubbles. Additionally, in the course of detection various kinds of logic operation of magnetic bubbles can be performed.

What is claimed is:

1. A method for electrically detecting an inverted magnetic field portion in a magnetic field which method comprises: disposing in a magnetic field at least two three-terminal Hall elements, each of said Hall elements having two input electrodes on opposite ends thereof and one Hall output electrode on one side thereof, said Hall elements being connected in parallel with respect to the input electrodes, said magnetic field having at least one inverted magnetic field portion, at least one of said Hall elements being subjected to said inverted magnetic field portion in the magnetic field at right angles, a second Hall element being positioned outside the path of said inverted magnetic field portion and being constantly subjected to the uninverted magnetic field, passing a current through the Hall elements across said input electrodes, measuring the output voltage across said output electrodes of said Hall elements, and detecting the presence of the inverted magnetic field by variation in the output voltage.

2. The method of claim 1 wherein said inverted magnetic field portion comprises at least one magnetic bubble.

3. The method of claim 1 wherein said inverted magnetic field portion comprises at least one magnetic strip domain.

4. The method of claim 1 wherein the boundary of the inverted magnetic field portion is applied to intersect the input electrodes on opposite ends of the at least one Hall element.

5. The method of claim 1 wherein the boundary of the applied inverted magnetic field portion is within the at least one Hall element.

6. The method of claim 2 wherein at least two of said Hall elements are each simultaneously subjected to a magnetic bubble.

7. The method of claim 3 wherein at least two of said Hall elements are each simultaneously subjected to a magnetic strip domain.

8. The method of claim 1 wherein the output electrodes of the respective Hall elements are positioned on the same side thereof with respect to the current flow therein.

9. The method of claim 1 wherein the output electrodes of the respective Hall elements are positioned on different sides with respect to the current flow therein.

10. The method of claim 1 wherein each of said at least two three-terminal Hall elements is further provided with means for driving magnetic bubbles.

11. An apparatus for electrically detecting an inverted magnetic field portion in a magnetic field which apparatus comprises, in combination, at least two three-terminal Hall elements, each of said Hall elements having two input electrodes on opposite ends thereof and one Hall output electrode on one side thereof, said Hall elements being connected in parallel with respect to the input electrodes, means for providing a magnetic field having at least one inverted magnetic field portion, means for applying said inverted magnetic field portion to at least one of said Hall elements, a second Hall element being disposed outside the path of said inverted magnetic field portion and being constantly subjected to the uninverted magnetic field, a current source passing to said Hall elements through said input electrodes, and means for measuring the output voltage across said Hall output electrodes.

12. The least one of claim 11 wherein the width of the at leastone Hall element is larger than the size of the inverted magnetic field portion.

13. The apparatus of claim 12 wherein the inverted magnetic field is a magnetic bubble.

14. The apparatus of claim 12 wherein the inverted magnetic field is a magnetic strip domain.

15. The apparatus of claim 11 wherein said output electrodes of said Hall elements are provided on the same side of the respective Hall elements with respect to the current flow therein.

16. The apparatus of claim 11 wherein said output electrodes of said Hall elements are provided on opposite sides of the respective Hall elements with respect to the current flow therein.

17. The apparatus of claim 11 wherein a plurality of Hall elements are exposed to said inverted magnetic field and are arranged in an array over the means for applying inverted and un-inverted magnetic field portions.

18. The apparatus of claim 17 wherein each said three-terminal Hall element is provided with a means for driving magnetic bubbles.

* * * * *